(12) United States Patent
Chang et al.

(10) Patent No.: US 11,257,704 B2
(45) Date of Patent: Feb. 22, 2022

(54) DEVICE FOR TRANSFERRING AND INTEGRATING MICRO-DEVICES AND METHOD OF TRANSFER

(71) Applicant: HON HAI PRECISION INDUSTRY CO., LTD., New Taipei (TW)

(72) Inventors: Wei-Chih Chang, New Taipei (TW); Chin-Yuan Lin, New Taipei (TW); Ying-Chieh Chen, New Taipei (TW); I-Min Lu, New Taipei (TW); I-Wei Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 194 days.

(21) Appl. No.: 16/384,128

(22) Filed: Apr. 15, 2019

(65) Prior Publication Data
US 2019/0318951 A1 Oct. 17, 2019

Related U.S. Application Data

(60) Provisional application No. 62/657,924, filed on Apr. 15, 2018.

(51) Int. Cl.
| | | |
|---|---|---|
| *H01L 21/683* | (2006.01) | |
| *H01L 25/075* | (2006.01) | |
| *H01L 33/62* | (2010.01) | |
| *B65G 47/74* | (2006.01) | |

(52) U.S. Cl.
CPC .......... *H01L 21/6835* (2013.01); *B65G 47/74* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC . H01L 21/6835; H01L 25/0753; H01L 33/62; H01L 2221/68354; H01L 2221/68363; H01L 2933/0066
See application file for complete search history.

(56) References Cited

U.S. PATENT DOCUMENTS

| | | | |
|---|---|---|---|
| 8,236,126 B2 | 8/2012 | Chen et al. | |
| 2013/0023073 A1 | 1/2013 | Horng et al. | |
| 2016/0141196 A1 | 5/2016 | Chang | |
| 2018/0053684 A1* | 2/2018 | Lin | ................... H01L 21/02068 |
| 2018/0294387 A1* | 10/2018 | Li | .......................... H01L 24/30 |

FOREIGN PATENT DOCUMENTS

| | | |
|---|---|---|
| CN | 105609455 A | 5/2016 |
| TW | 201203398 A1 | 1/2012 |
| TW | 201306297 A1 | 2/2013 |
| TW | 201446526 A | 12/2014 |

\* cited by examiner

*Primary Examiner* — Mohammad M Choudhry
(74) *Attorney, Agent, or Firm* — ScienBiziP, P.C.

(57) ABSTRACT

A device for transferring micro-devices from a holding device to a final surface, avoiding damage during the process and ensuring coplanar presentation onto the final surface, includes a first substrate on the holding device. The holding device carries at least one transfer substrate which itself carries a plurality of micro-devices. At least one buffering member is located between the first substrate and the transfer substrate. The buffering member provides a small range of buffering for the micro-devices during the transfer and also compensates for any slight unevenness when the micro-devices are laid on and bonded to the final surface. A method for transferring the micro-devices is also disclosed.

9 Claims, 13 Drawing Sheets

DEVICE FOR TRANSFERRING AND INTEGRATING MICRO-DEVICES AND METHOD OF TRANSFER

FIELD

The subject matter herein generally relates to processes of manufacture in micro-scale.

BACKGROUND

Micro-devices can be transferred to a receiving substrate for integration. The micro-devices may be micro-LEDs which are used as in a display. The micro-LEDs may be controlled to emit lights so that the display can display images. However, the micro-devices, especially micro-LEDs, are fragile and very brittle, and easily damaged during a transfer process.

Therefore, there is room for improvement in the art.

BRIEF DESCRIPTION OF THE DRAWINGS

Implementations of the present technology will now be described, by way of embodiments, with reference to the attached figures.

DETAILED DESCRIPTION

Figure 1:
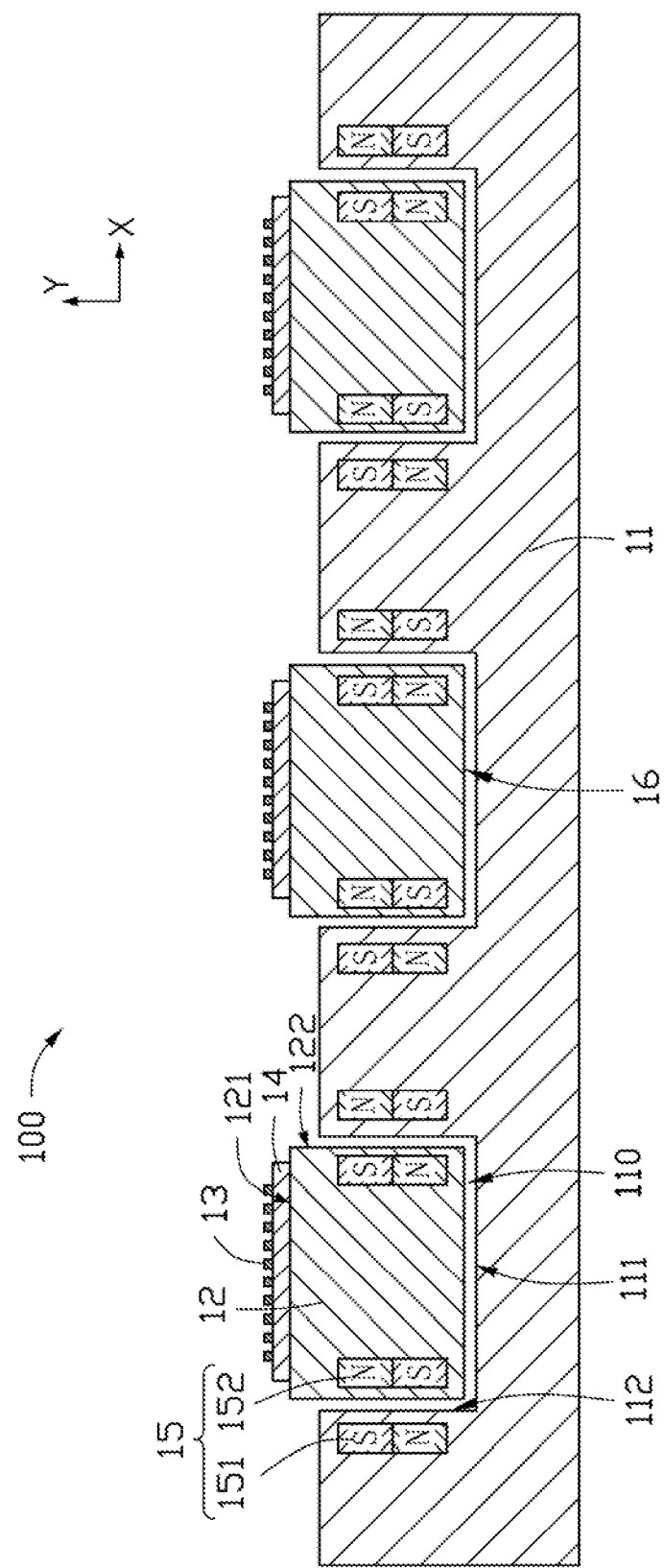
FIG. 1 is a cross-sectional view of a transfer device according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

As shown in FIG. 1, a transfer device 100 of a first embodiment may be used to transfer micro-devices 13. The transfer device 100 comprises a first substrate 11. At least one well 110 is formed on the first substrate 11. In this embodiment, a plurality of wells 110 are formed on the first substrate 11. FIG. 1 shows only three of the wells 110. Each well 110 is formed as a depression from a top surface of the first substrate 11 toward a bottom surface of the first substrate 11. The well 110 includes a first bottom surface 111 adjacent to the bottom surface of the first substrate 11 and a first sidewall 112 serving as the wall. The first bottom surface 111 is rectangular, but not limited to such shape. Each well 110 further comprises sidewalls 112 extending from four sides of the first bottom surface 111 toward the mouth of the well 110. The first bottom surface 111 is configured as a supporting surface. Each well 110 accommodates one platform 12. A length of the platform 12 along the X direction, as in FIG. 1, is between 5 mm and 50 mm, and a distance between adjacent platforms 12 in the X direction is between 5 mm and 50 mm. A side of the platform 12 away from the first bottom surface 111 carries a transfer substrate 14, which can carry a plurality of micro-devices 13 (eg, micro light emitting diodes (Micro-LEDs)). In this embodiment, the material of the transfer substrate 14 is rigid.

The platform 12 further comprise a second surface 121 away from the first bottom surface 111, and a second sidewall 122 the first sidewall 121. The second surface 121 is configured to carry the transfer substrate 14. Indirectly underneath the transfer substrate 14, a buffering member 15 is provided in a space between the first bottom surface 111 and the transfer substrate 14. The buffering member 15 provides buffering when transferring the micro-devices 13 from the transfer substrate 14 to a receiving substrate (not shown). A receiving substrate may be such as a thin film transistor substrate, configured to drive the micro-devices 13 into operation. The buffering member 15 prevents damage to the micro-devices 13 when being transferred and laid in place. The buffering space for the buffering member 15 is defined in a space from a horizontal plane defined by the first bottom surface 111 to a horizontal plane defined by a surface of the transfer substrate 14 close to the first bottom surface 111.

The buffering member 15 can be for example magnetic (hereinafter "magnetic generator"), utilizing a magnetic field to maintain the platform 12 in a suspended state in the well 110. The forces of repulsion and attraction within the magnetic field keep the platform 12 substantially in place when transferring the micro-devices 13 but allow for slight movement of each platform 12. The magnetic generator comprises magnet groups, each magnet group includes a pair of magnets configured for magnetic interaction. One magnet of the pair is located in the first sidewall 112, and the other one of the pair is located in the second sidewall 121. Two magnet groups are provided in each well, in other embodiments, three or four magnet groups may be provided in each well.

Each magnet group includes a first magnet 151 embedded in the first sidewall 112 and a second magnet 152 embedded in the second sidewall 121. Magnetic field directions of the first magnet 151 and that of the second magnet 152 are opposite to each other, and the first magnet 151 and the second magnet 152 in each magnet group are located face to face so as to interact magnetically. At the same time, an N pole of the first magnet 151 faces to an S pole of the second magnet 152, and an S pole of the first magnet 151 faces to an N pole of the second magnet 152, so as to generate attraction between the two. The combined effect of repulsion and attraction suspends the platform 12 in the well 110. A space generated by the suspending action forms the buffering space 16 between the platform 12 and the well 110, and provides the buffering for the platform 12 when the transfer device 100 is pressured downwards.

Figure 2:
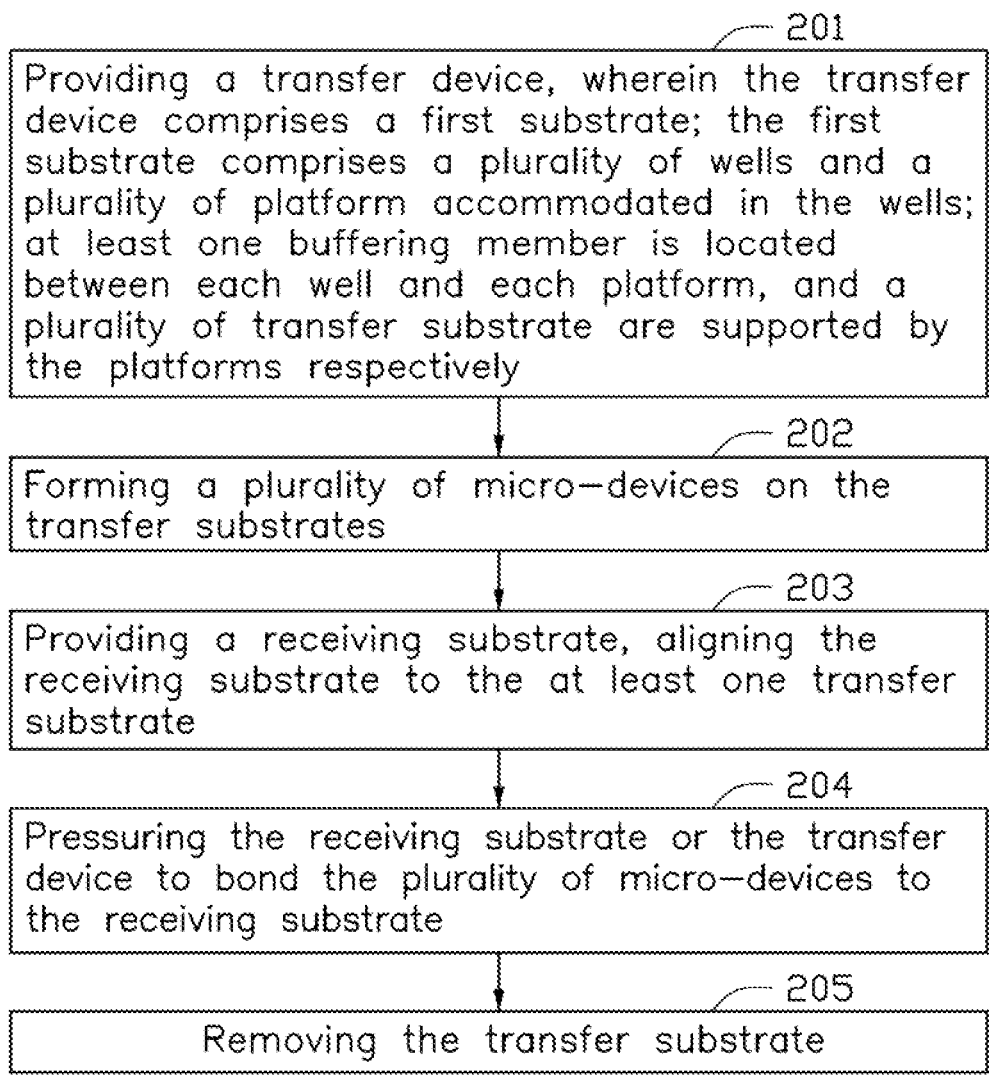
FIG. 2 is a flowchart of a method for the transfer of micro-devices using the transfer device according to the first embodiment.
Figure 3:
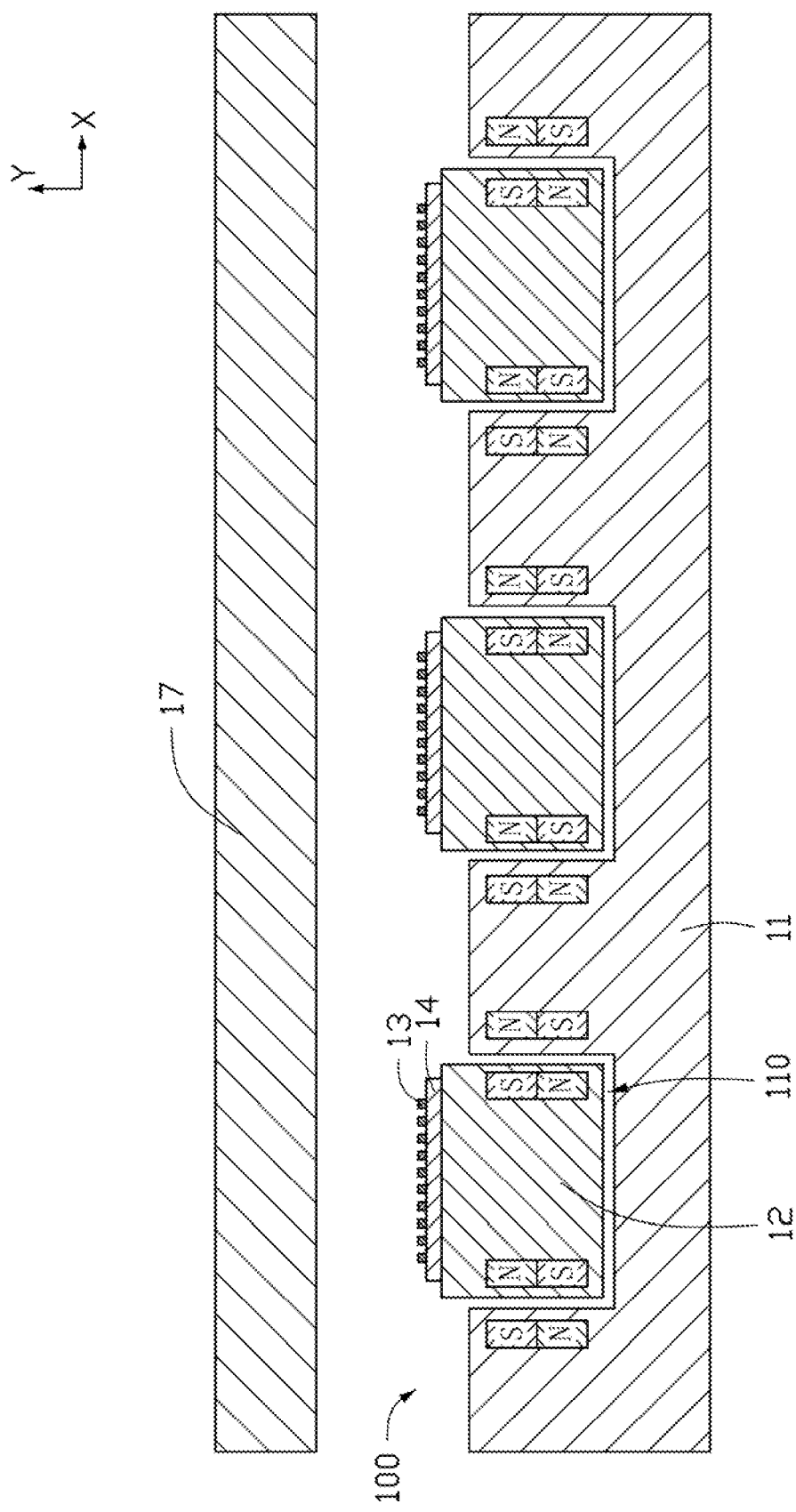
FIG. 3 is a schematic view showing the transfer of the micro-devices using the transfer device according to the first embodiment.

Referring to FIG. 2 and FIG. 3, a method for transferring the micro-device 13 to a receiving substrate comprises steps of step S201, providing the transfer device 100 having a plurality of the wells 100 and step S202 provides the transfer substrates 14 with the same number of the wells 110 and forms the micro-devices 13 on the transfer substrates 14. In step S203, a receiving substrate 17 is aligned with the transfer substrates 14 and step S204 applies a pressure to bring the transfer substrate 14 into contact with the receiving substrate 17 and transferring the micro-devices 13 to the receiving substrate 17. In step S205 the transfer substrate 14 is removed.

In step S201 the transfer device 100 is provided, the transfer device 100 comprises a plurality of wells 110 and each platform 12 is accommodated in one well 110. At least one buffering member 15 is located between each well 110 and each platform 12.

In step S202 a plurality of micro-devices 13 are formed on each transfer substrate 14.

In step S203, as FIG. 3 shows, a receiving substrate 17 for receiving the micro-devices 13 is provided, the receiving substrate 17 is aligned with the transfer substrate 14. In the embodiment, the receiving substrate 17 has a plurality of regions (not shown) each corresponding to one transfer substrate 14.

In step S204 the transfer device 10 moves along a predetermined path so as to apply a pressure onto the receiving substrate 17, the transfer of the micro-devices 13 to the receiving substrate 17 thus takes place.

In this embodiment, pressure in a direction toward the micro-devices 13 may be applied to the receiving substrate 17. In an embodiment, pressure in a direction toward the receiving substrate 17 may be applied to the transfer device 100. In other embodiment, the above mentioned pressures can be applied to the receiving substrate 17 and the transfer device 100 simultaneously.

An adhesive material (not shown) can be formed on a surface of the receiving substrate 17 for bonding the micro devices 13.

When pressuring the transfer device 100 to the receiving substrate 17, or pressuring the receiving substrate 17 to the transfer device 100, the buffering member 15 can compensate for the micro-devices 13 being subjected to uneven forces due to an uneven thickness of a transfer substrate 14. The respective height of each micro-device 13 is adjustable, such that all the micro-devices 13 can be in a coplanar position for bonding to the receiving substrate 17, damage to the micro-devices 13 is thus prevented.

In step S205, the transfer device 100 is removed.

The receiving substrate 17 can be a thin film transistor (TFT) substrate that is used in a display device, and the micro-device 13 is a Micro-LED. In this embodiment, the receiving substrate 17 can be divided into a plurality of regions, each region corresponding to at least one well 110. The micro-devices 13 can be transferred to a designated region by using the mass transferring method. In this embodiment, the method for such micro-devices 13 can improve the transfer efficiency.

In an embodiment, the receiving substrate 17 is divided according to the number or the design of the transfer substrate 14 or of the wells 110. In an embodiment, the receiving substrate 17 can be divided into a plurality of first regions and a plurality of second regions, each of the first regions is between adjacent second regions. The transfer device 100 may transfer the micro-devices 13 into the first regions and into the second regions by two transfer processes.

Figure 4:
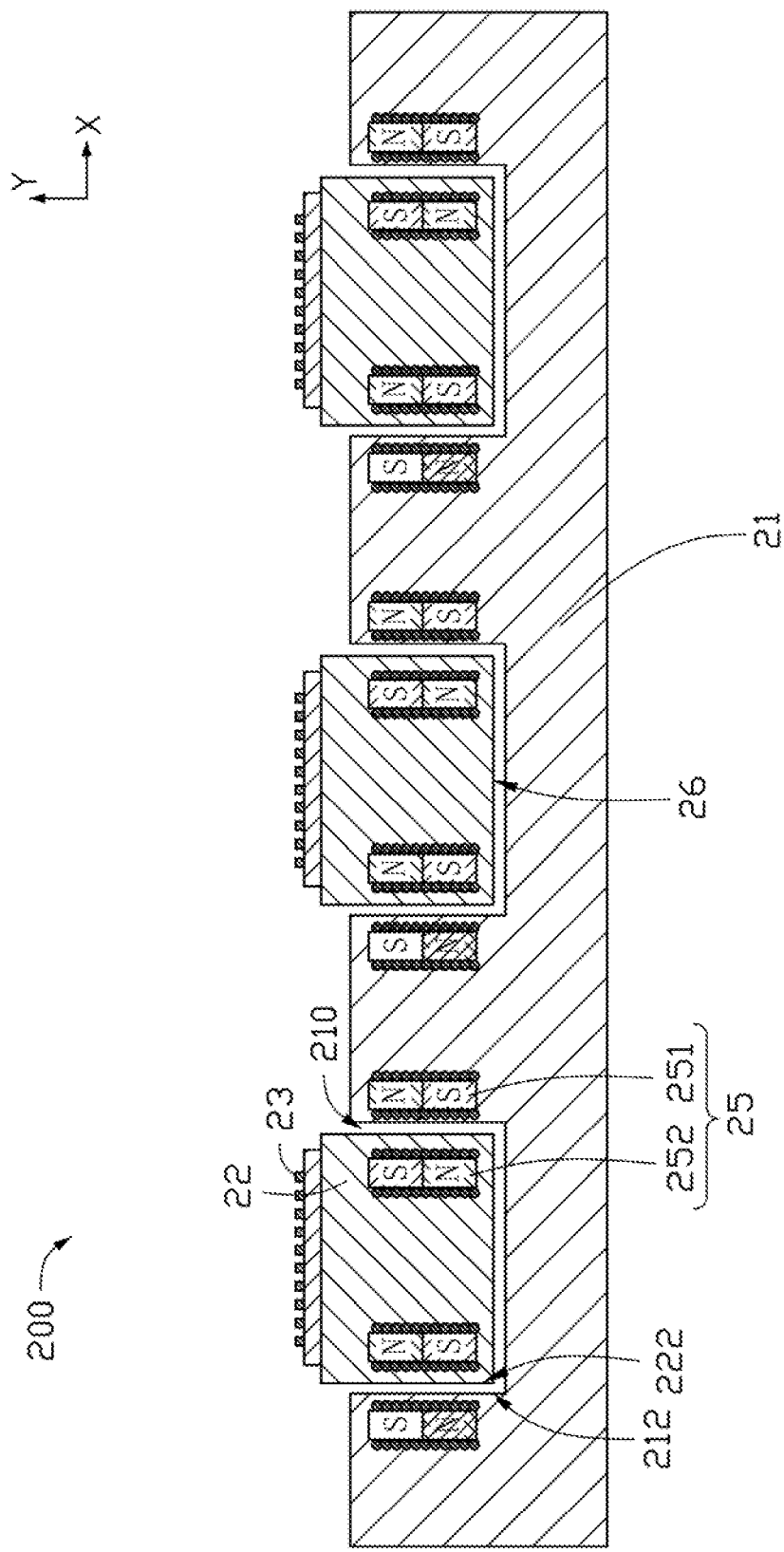
FIG. 4 is a cross-sectional view of a transfer device according to a second embodiment of the present disclosure.

As shown in FIG. 4, a transfer device 200, in a second embodiment is similar to the transfer device 100, except that the first magnets 151 and the second magnets 153 of the transfer device 100 can be replaced by electromagnets, magnitudes of the magnetic forces and directions of the magnetic fields are controlled by the current flowing through coils of the electromagnets.

Herein, the buffering member 25, as a magnetic generator, can comprise plurality of electromagnet groups, each electromagnet group including a pair of electromagnets. One electromagnet is located in the first sidewall 212, and the other one is located in the second sidewall 221. Two electromagnet groups are provided in each well. In other embodiments, three or four electromagnet groups may be provided in each well. Specifically, in this embodiment, each electromagnet group includes a first electromagnet 251 embedded on the first sidewall 212 and a second electromagnet 252 embedded on the second sidewall 221. The magnetic fields of the first electromagnet 251 and that of the second electromagnet 252 are opposite to each other, and the first electromagnet 251 and the second electromagnet 252 in each electromagnet group are located face to face so as to generate repulsion. At the same time, an N pole of the first magnet 251 faces to an S pole of the second magnet 252, and an S pole of the first magnet 251 faces to an N pole of the second magnet 252, so as to generate attraction. The combined effect of the repulsion and attraction is to suspend the platform 22 in the well 210. A space generated by the suspending action forms the buffering space 26 between the platform 22 and the well 210, and provides the buffering of the platform 22 when the transfer device 200 is pressured downwards.

It can be understood that, a method for transferring micro-devices 23 by transfer device 200 is similar to the method for transferring micro-device 13 by transfer device 100.

Figure 5:
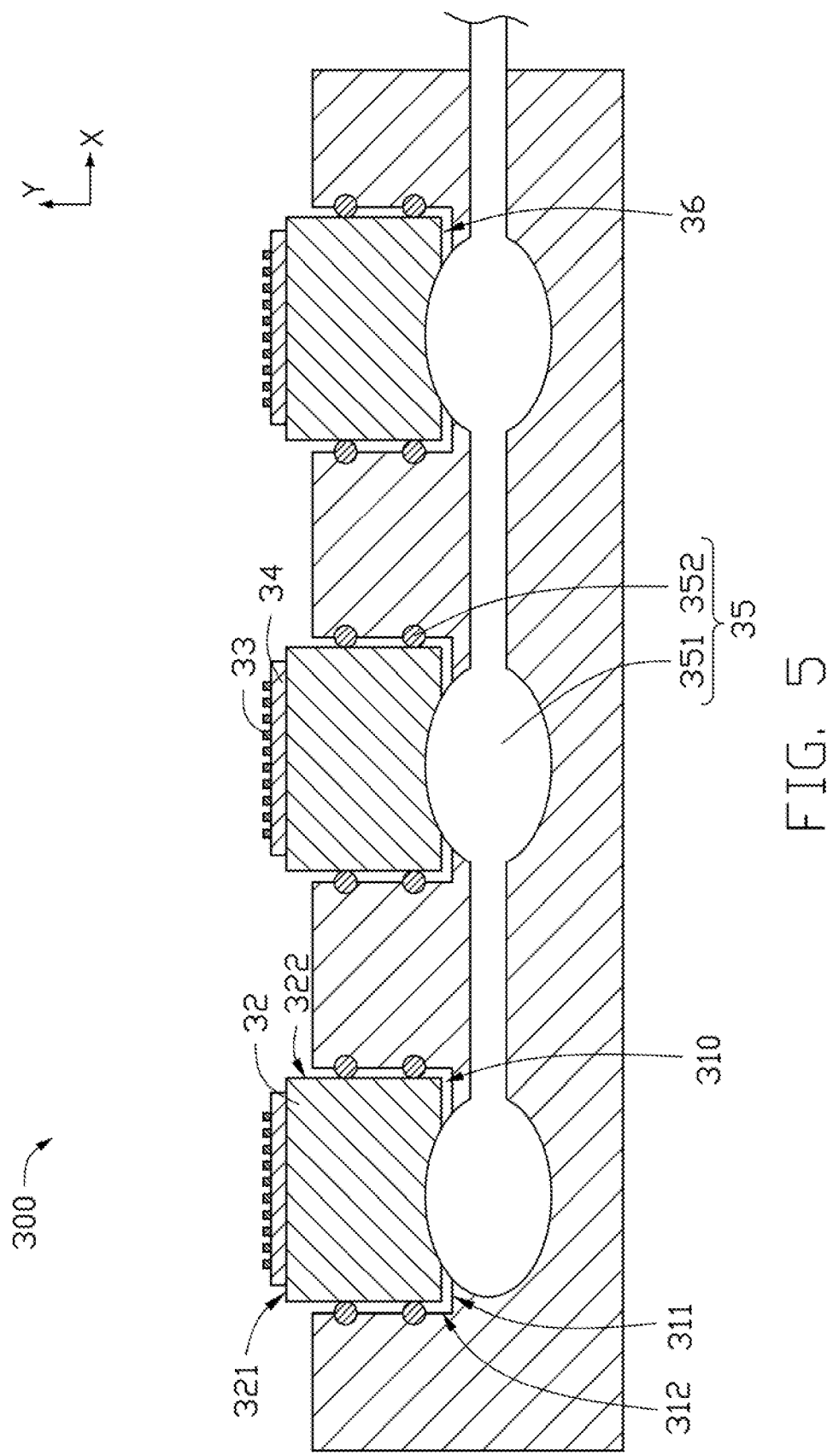
FIG. 5 is a cross-sectional view of a transfer device according to a third embodiment of the present disclosure.

As shown in FIG. 5, a transfer device 300 of a third embodiment comprises a first substrate 31. The transfer device 300 is similar to the transfer device 100, components having the same structure and function as those of the transfer device 100 of the first embodiment will not be described herein. A least one of well 310 is formed on a surface of the first substrate 31. In this embodiment, a plurality of wells 310 are formed on the surface of the first substrate 31. Each well 310 is formed as a depression from a top surface of the first substrate 11 toward a bottom surface of the first substrate 11, and includes a first bottom surface 111 and a plurality of first sidewalls 312 extending from four sides of the first bottom surface 311 toward the mouth of the well 310. The first bottom surface 311 is configured as a supporting surface.

At least one platform 32 is accommodated in each well 310, in this embodiment, each well 310 accommodate with one platform 32. A length of the platform 32 along the X direction in FIG. 5 is between 5 mm and 50 mm, and a distance between two adjacent platforms 32 in the X direction of FIG. 1 is between 5 mm and 50 mm. A side of the platform 32 away from the first bottom surface 311 is provided with a transfer substrate 34, the transfer substrate 34 is used for carrying a plurality of micro-devices 33 (eg, Micro-LED). In this embodiment, the transfer substrate 14 is rigid.

The platform 32 further comprise a second surface 321 away from the first bottom surface 311, and a plurality of second sidewalls 322 facing with the first sidewalls 321. The second surface 321 is used to carry the transfer substrate 34. Indirectly underneath the transfer substrate 34, a buffering member 35 is provided in the first substrate 31. The buffering member 35 provides buffering during the transfer of the micro-devices 33 and prevents damage to the micro-devices 33.

The buffering members 35 includes air bags 351. Each of the transfer substrates 34 has one air bag 351 underneath, and the air bag 351 can be deformed by force. Specifically, the air bags 351 are fixed in the first substrate 31 and partially protrude from the first bottom surface 311 to support the platform 32. The airbags 351 are connected to an air inlet device (not shown) via a duct 353 connected between the airbags 351 and the air inlet device. A plurality of rollers 352 are formed in the first substrate 11. Each roller 352 is formed on the first sidewall 312 and is in contact with the second sidewall 322. The rollers 352 can not only allow the platform 352 slide along a rolling direction of the rollers 352 in the well 310 when the platform 352 is subjected to a force, but also avoid the platform 32 moving in the well 310 in a direction perpendicular to the second side wall 322. The air bag 351 forms a buffering space 36 between the platform 32 and the well 310, and the air bags 351 provides a buffering space for the platform 32 when the transfer device 300 is applied with a downward force.

It can be understood that, a method for transferring micro-devices 33 by transfer device 300 is similar to the method for transferring micro-device 13 by transfer device 100.

Figure 6:
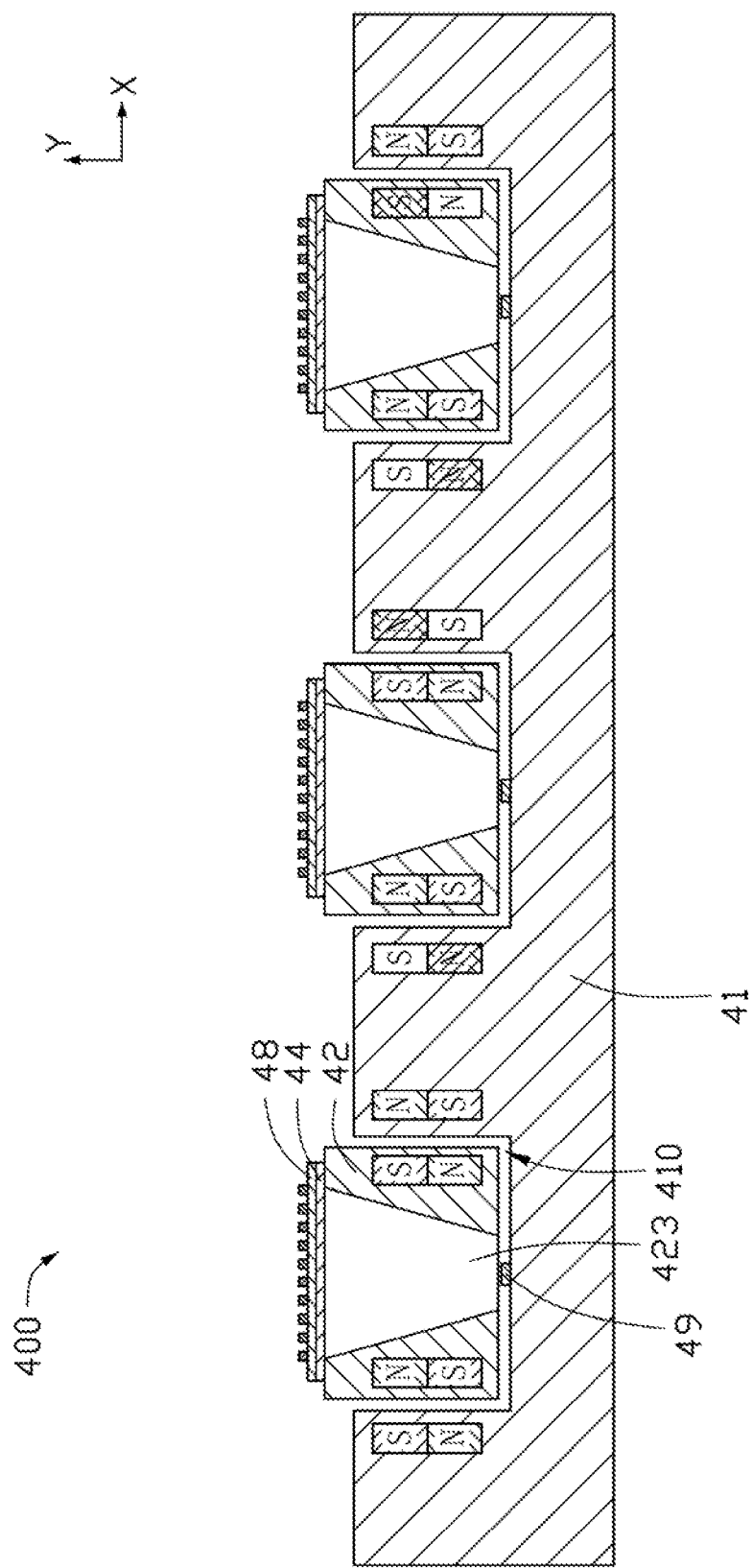
FIG. 6 is a cross-sectional view of a transfer device according to a fourth embodiment of the present disclosure.

As shown in FIG. 6, a transfer device 400 of a fourth embodiment is similar to the transfer device 100 of the first embodiment, components having the same structure and function as those of the transfer device 100 of the first embodiment will not be described herein. In this embodiment, a material of the platform 42 is rigid and opaque, and the platform 42 is provided with an opening 423 through the platform 42 in a thickness direction (Y direction in FIG. 6) of the platform 42. As shown in FIG. 6, the opening 423 has a trapezoidal cross section, and a long side of the trapezoid is adjacent to the side of the transfer substrate 44 comparing to a short side. The transfer substrate 44 and the micro-devices 43 carried by the transfer substrate 44 are bonded together by an adhesive layer 48. The first bottom surface 411 of each well 410 of the transfer device 400 is provided with at least one ultraviolet light source 49. The adhesive layer 48 can be irradiated by ultraviolet lights emitted by the ultraviolet light source 49 through the opening 423, and after the adhesive layer 48 is irradiated, its viscosity is lowered, thereby facilitating the peeling of the transfer substrate 44 after the micro-devices 43 are bonded to a receiving substrate.

Figure 7:
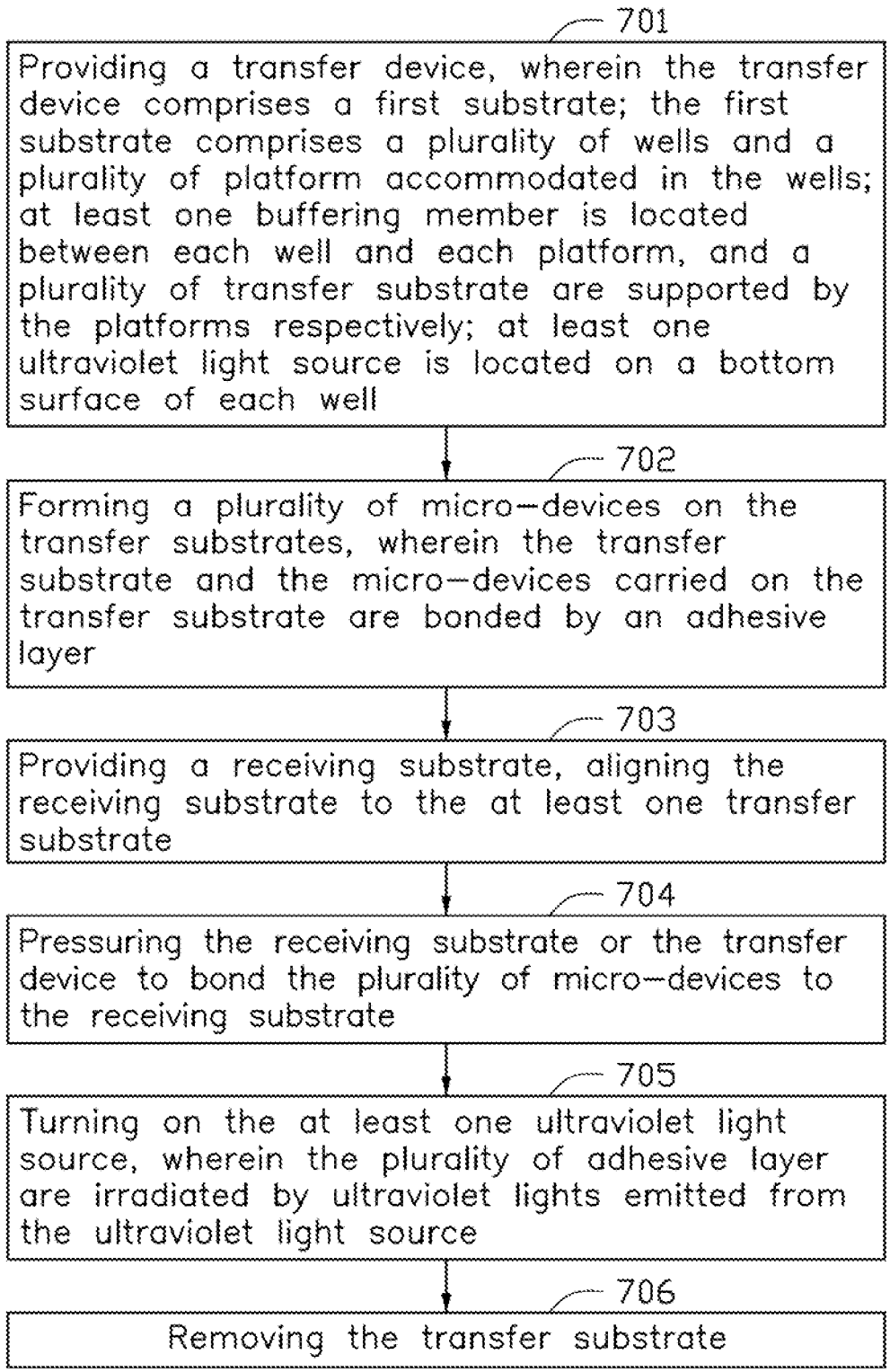
FIG. 7 is a flowchart of a method for the transfer of micro-devices using the transfer device according to the fourth embodiment.
Figure 8:
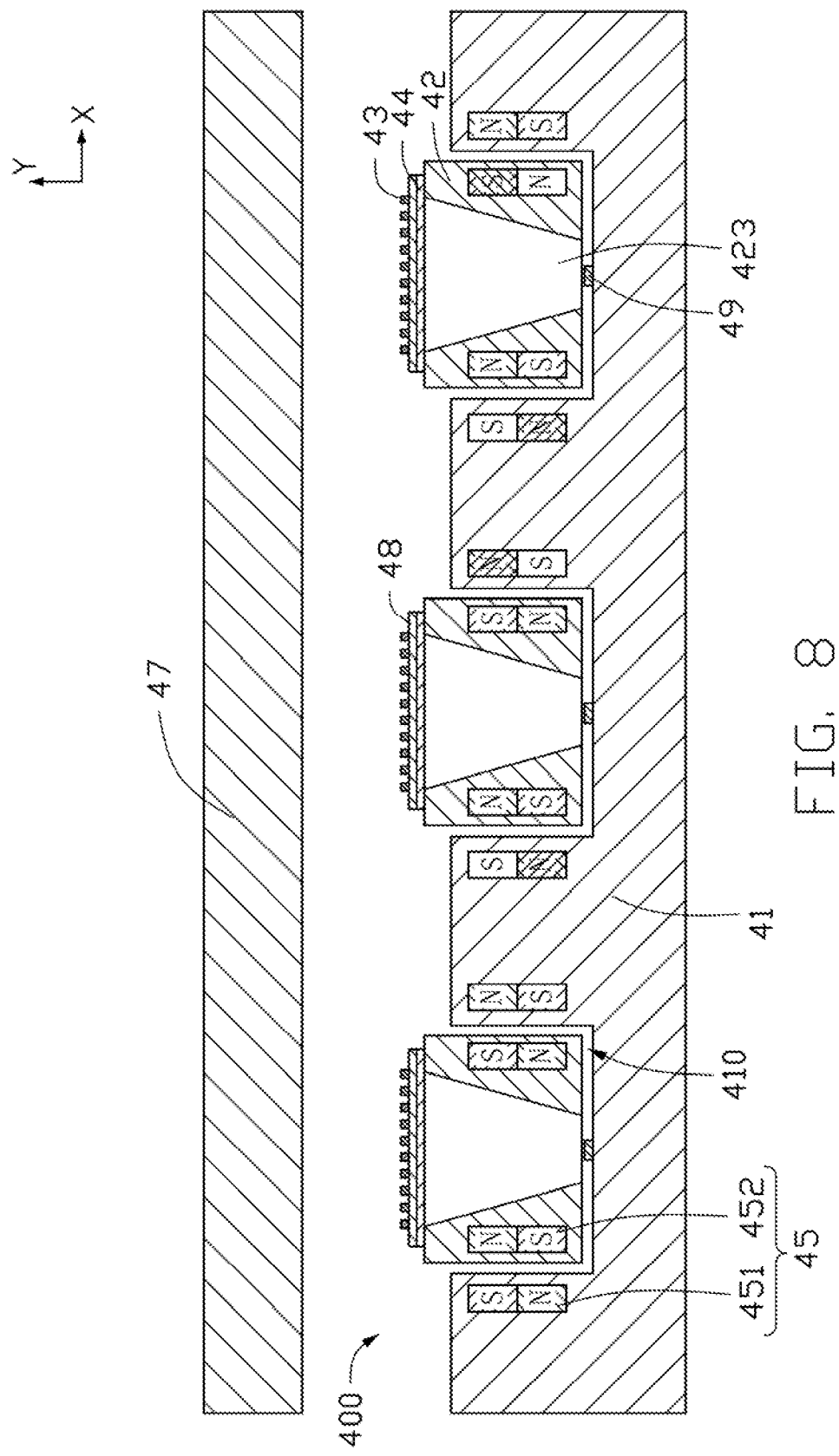
FIG. 8 is a schematic view showing the transfer of the micro-devices using the transfer device according to the fourth embodiment.

As shown in FIG. 7 and FIG. 8, a method for transferring the micro-device 43 to a receiving substrate comprises steps of step S701, providing the transfer device 400 having a plurality of the wells 400 and step S702 provides the transfer substrates 44 with the same number of the wells 400 and forms the micro-devices 43 on the transfer substrates 44. In step S703, a receiving substrate 47 is aligned with the transfer substrates 44 and step S704 applies a pressure to bring the transfer substrate 44 into contact with the receiving substrate 47 and transferring the micro-devices 43 to the receiving substrate 47. In step 705 the ultraviolet light source 49 is turned on to irradiate the adhesive layer 48 and step S706 removes the transfer substrates 14.

In step S701 the transfer device 100 is provided, the transfer device 100 comprises a plurality of wells 110 and each platform 12 is accommodated in one well 110. At least one buffering member 15 is located between each well 110 and each platform 12

In this embodiment, the material of the platform 42 is rigid and opaque, and each platform 42 is provided with an opening 423 through the platform 42 in a thickness direction (Y direction in FIG. 8) of the platform 42. The first bottom surface 411 of each well 410 of the transfer device 400 is provided with at least one ultraviolet light source 49.

In step S702 a plurality of micro-devices 43 are formed on the transfer substrate 44, the transfer device 400 further comprises a adhesive layer 48 configured to bond the transfer substrate 44 and the micro-devices 43 carried on the transfer substrate 44.

In step S703, as FIG. 8 shows, a receiving substrate 47 for receiving the micro-devices 43 is provided, the receiving substrate 47 is aligned with the transfer substrates 44.

In step S704, pressure is applied to the receiving substrate 47 or the transfer device 400, the transfer of the micro-devices 43 to the receiving substrate 47 thus take place.

In this embodiment, pressure in a direction toward the micro-devices 43 may be applied to the receiving substrate 47. In an embodiment, pressure in a direction toward the receiving substrate 47 may be applied to the transfer device 400. In other embodiment, the above mentioned pressures can be applied to the receiving substrate 47 and the transfer device 400 simultaneously.

It can be understood that, a surface of the receiving substrate 47 may be formed with an adhesive material (not shown) to bond the micro device 43.

When pressuring the transfer device 400 to the receiving substrate 47, or pressuring the receiving the substrate 47 to the transfer device 100, the buffering member 45 can compensate for the micro-devices 43 being subjected to uneven forces due to an uneven thickness of a transfer substrate 44. The respective height of each micro-device 43 is adjustable, such that all the micro-devices 43 can be in a coplanar position for bonding to the receiving substrate 47, damage to the micro-devices 43 is thus prevented.

In step S705, the ultraviolet light source 49 is turned on, ultraviolet lights emitted from the ultraviolet source 49 is irradiated to the adhesive layer 48.

In step S70, the transfer device 100 is removed.

In this embodiment, the adhesive layer 48 can be irradiated by ultraviolet lights emitted by the ultraviolet light source 49 through the opening 423. After the adhesive layer 48 is irradiated, its viscosity is lowered, thereby facilitating the peeling of the transfer substrate 44 after the micro-devices 43 are bonded to a receiving substrate.

Figure 9:
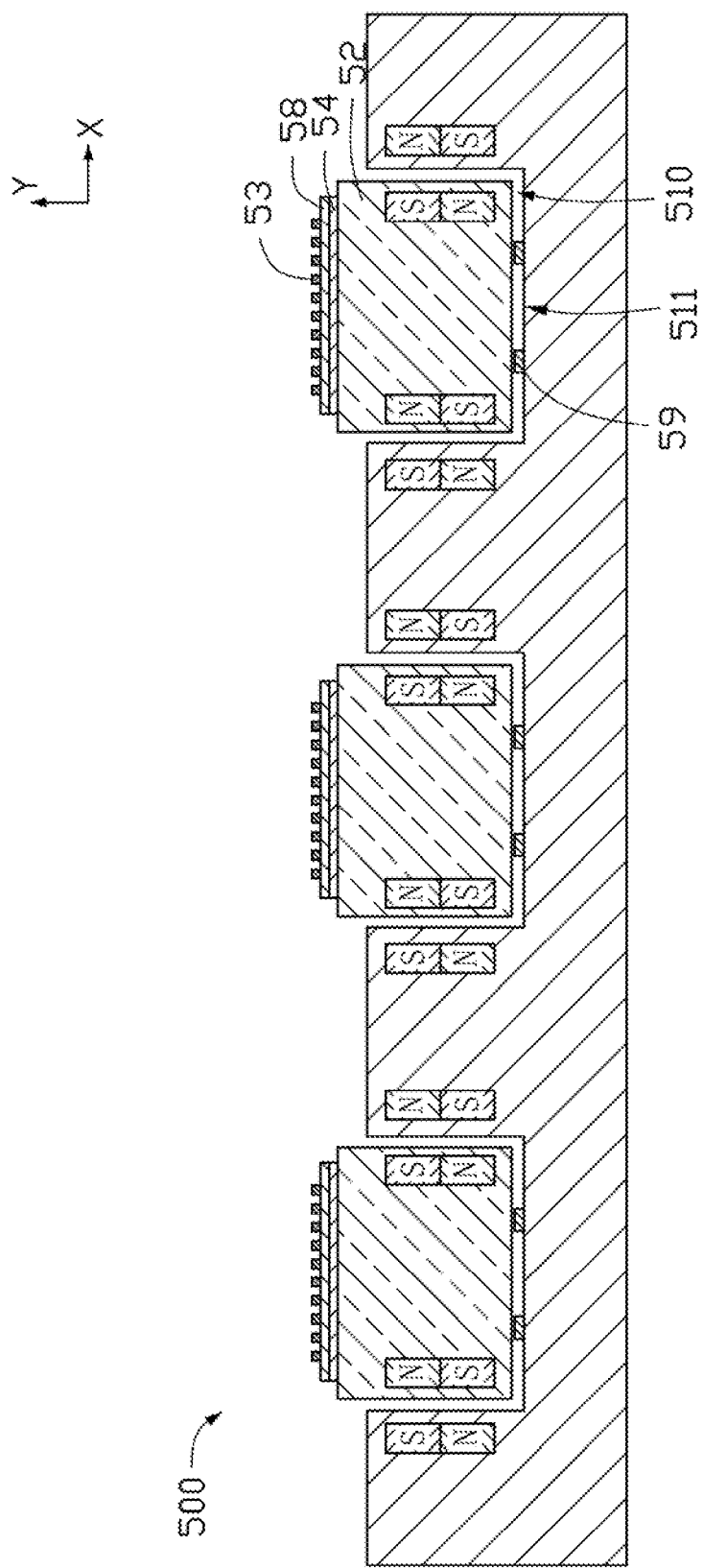
FIG. 9 is a cross-sectional view of a transfer device according to a fifth embodiment of the present disclosure.

As shown in FIG. 9, a transfer device 500 of a fifth embodiment is similar to the transfer device 100 of the first embodiment, components having the same structure and function as those of the transfer device 100 of the first embodiment will not be described herein. In this embodiment, a material of the platform 52 is transparent. The platforms 52 may be made of light transmitting materials, such as glass, acrylic, sapphire or the like. The transfer substrate 54 and the micro-devices 53 carried by the transfer substrate 54 are bonded together by an adhesive layer 58. The first bottom surface 511 of each well 510 of the transfer device 500 is provided with at least one ultraviolet light source 59. In this embodiment, the first bottom surface 511 of each well 510 is provided with two ultraviolet light sources 59. The adhesive layer 58 can be irradiated by ultraviolet lights emitted by the ultraviolet light source 59 through the platform 52, and after the adhesive layer 48 is irradiated, its viscosity is lowered.

It can be understood that, a method for transferring micro-devices 53 by transfer device 500 is similar to the method for transferring micro-device 43 by transfer device 400.

Figure 10:
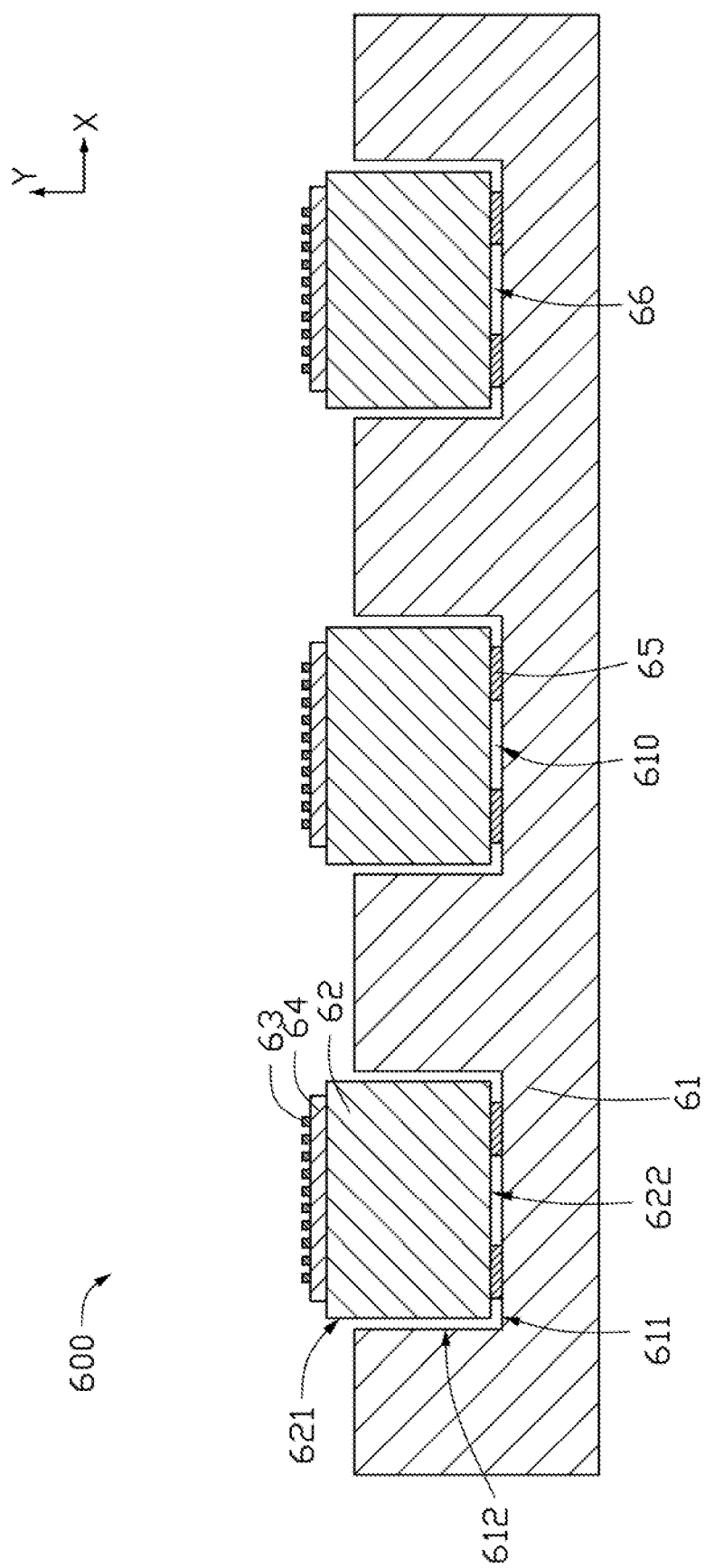
FIG. 10 is a cross-sectional view of a transfer device according to a sixth embodiment of the present disclosure.

As shown in FIG. 10, a transfer device 600 of a sixth embodiment comprises a first substrate 61. A plurality of wells 610 are formed on a surface of the first substrate 61. Each well 610 includes a first bottom surface 611 and a plurality of first sidewalls 612 extending from four sides of the first bottom surface 611 toward the month of the well 610. The first bottom surface 611 is used as a supporting surface.

At least one platform 62 is accommodated in each well 610, in this embodiment, each well 610 accommodate with one platform 62. A length of the platform 62 along the X direction in FIG. 10 is between 5 mm and 50 mm, and a distance between adjacent platforms 62 in the X direction of FIG. 10 is between 5 mm and 50 mm. A side of the platform 62 away from the first bottom surface 611 is provided with a transfer substrate 64, the transfer substrate 64 is used for carrying a plurality of micro-devices 63 (eg, Micro-LED).

The platform 62 further comprise a second surface 621 away from the first bottom surface 611, and a plurality of second sidewalls 122 facing with the first sidewalls 621. The second surface 621 is used to bond and carry the transfer substrate 64. Under the transfer substrate 64, a buffering member 65 is provided in the first substrate 61. In this embodiment, the buffering member 65 is a spring. It can be understood that, in an embodiment, the buffering member may be an elastomer, such as natural rubber, isoprene rubber, butadiene rubber, chloroprene rubber, ethylene propylene copolymer (EPM), chloroether rubber (ECO), acrylate rubber (ACM), acrylate butadiene rubber (ABR), silicon (Si), methyl vinyl silicone rubber (VMQ) or fluorinated silicone rubber (FVMQ). The buffering member 65 is capable of providing a buffering force during the transfer of the micro-devices 63 to prevent the micro-devices 63 from being damaged by excessive stress.

It can be understood that, a method for transferring micro-devices 63 by transfer device 600 is similar to the method for transferring micro-device 13 by transfer device 100.

Figure 11:
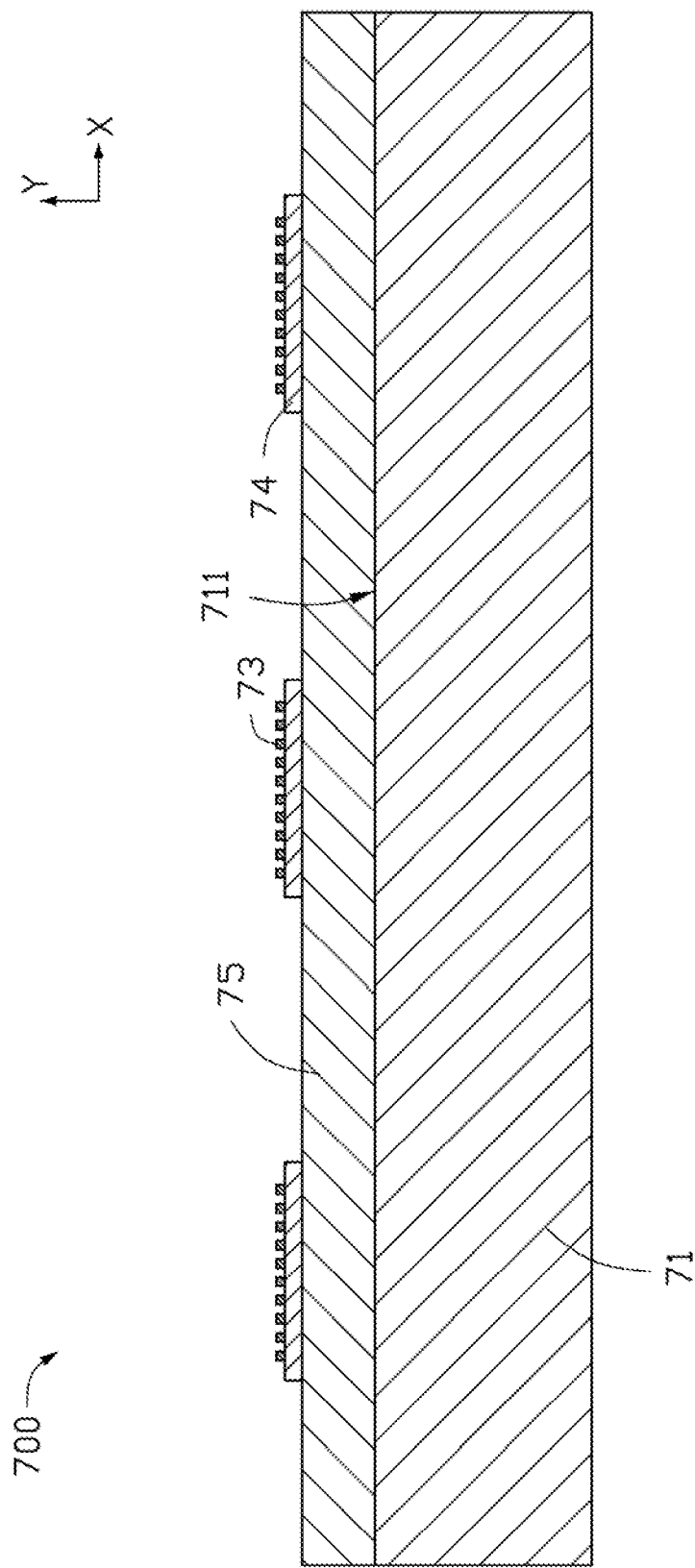
FIG. 11 is a cross-sectional view of a transfer device according to a seventh embodiment of the present disclosure.

As shown in FIG. 11, a transfer device 700 of a seventh embodiment comprises a first substrate 71. A transfer substrate 74 is located on a side of the first substrate 71, the transfer substrate 74 is used for carrying a plurality of micro-devices 13 (eg, Micro-LED). The first substrate 71 comprises a surface 711, the transfer substrate 74 is located on the surface 711, a buffering member 75 is located between the first substrate 71 and the transfer substrate 74. In this embodiment, the transfer substrate 74 is rigid. The buffering member 75 may be an elastomer, such as natural rubber, isoprene rubber, butadiene rubber, chloroprene rubber, EPM, ECO, ACM, ABR, Si, VMQ or FVMQ. The buffering member 75 has a thickness between 10 μm and 1000 μm. The buffering member 75 is capable of providing a buffering force during the transfer of the micro-devices 73 to prevent the micro-devices 73 from being damaged by excessive stress. It can be understood that, in other embodiment, the buffering member 75 may be an air bag, a spring or the like.

Figure 12:
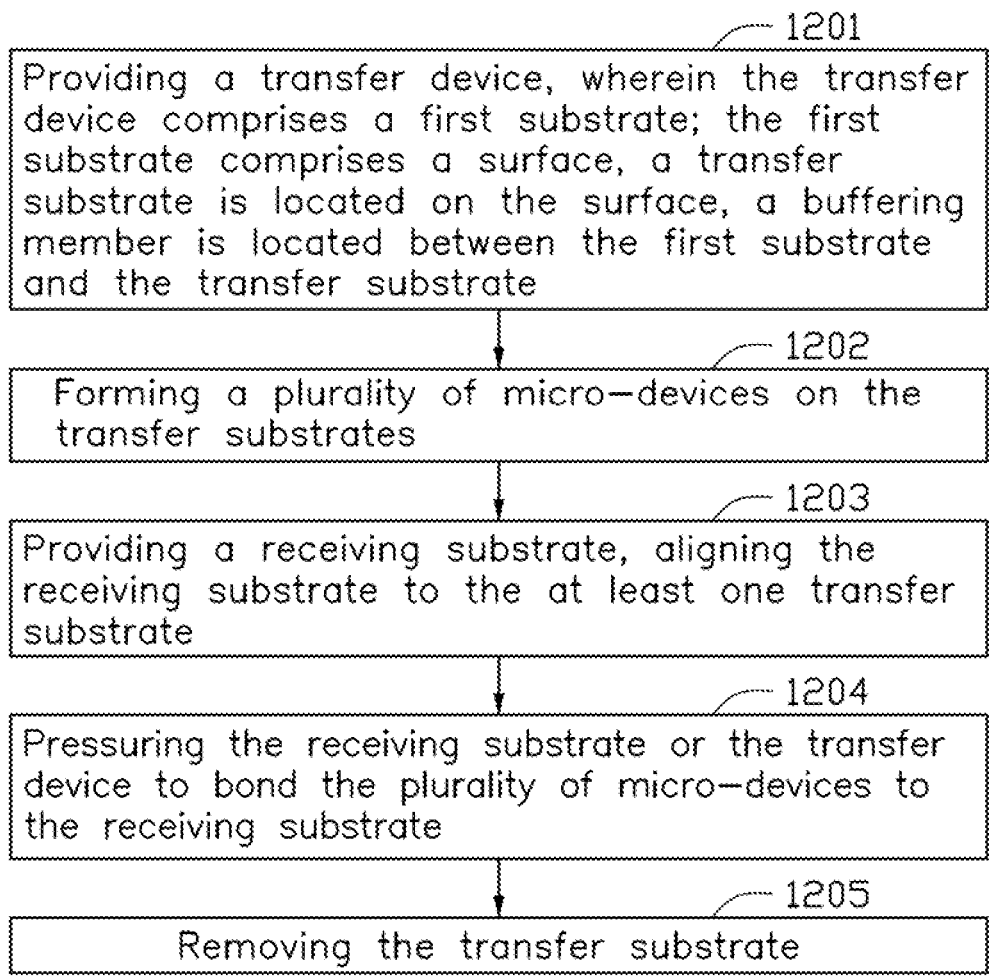
FIG. 12 is a flowchart of a method for the transfer of micro-devices using the transfer device according to the seventh embodiment.
Figure 13:
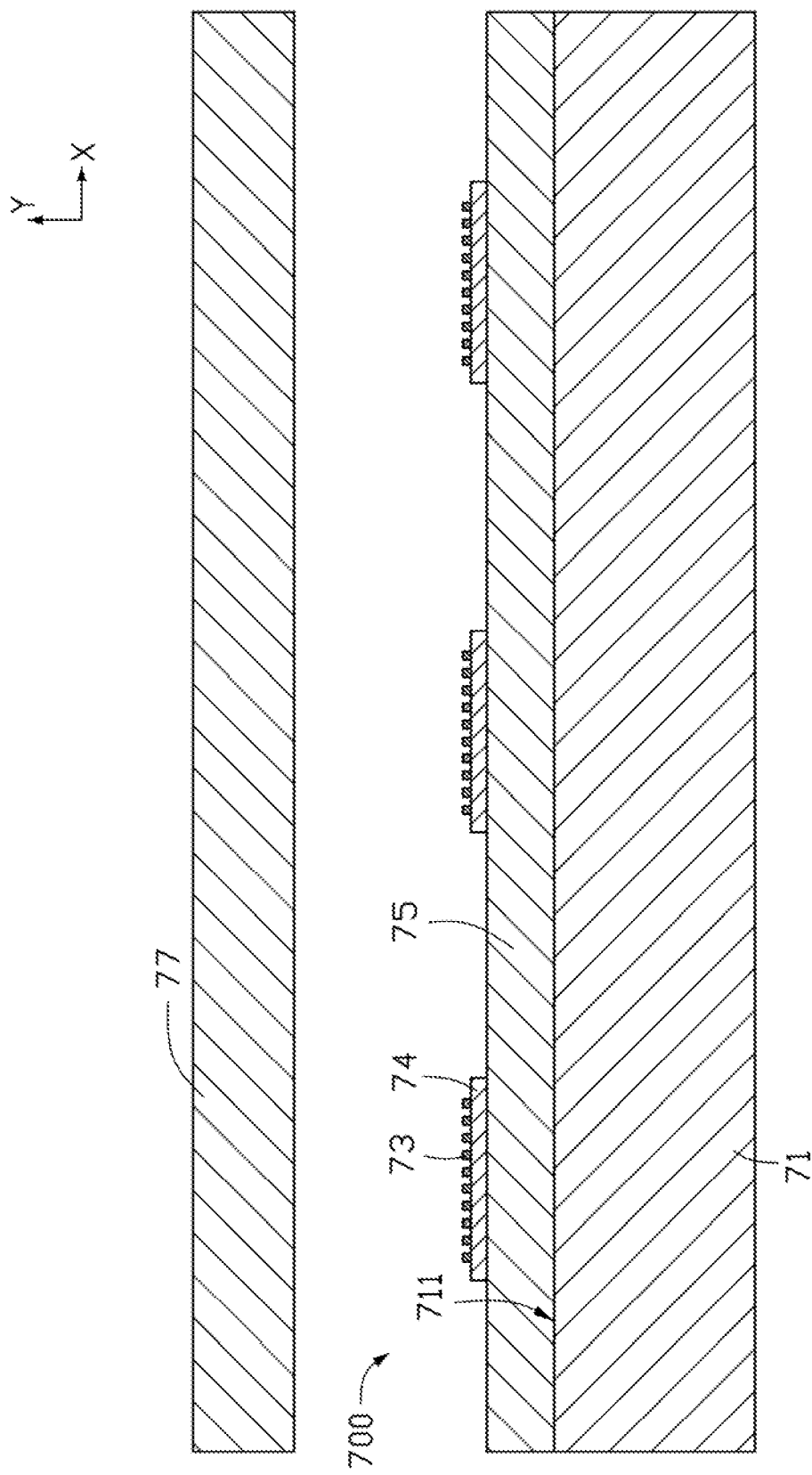
FIG. 13 is a schematic view showing the transfer of the micro-devices using the transfer device according to the seventh embodiment.

As shown in FIG. 12 and FIG. 13, a method for transferring the micro-device 73 to a receiving substrate 17 comprises steps of step S1201, the transfer device 700 which comprises a first substrate 11 is provide. The first substrate 71 comprises a surface 711, a transfer substrate 74 is located on the surface 711, a buffering member 75 is located between the first substrate 71 and the transfer substrate 74.

The material of the transfer substrate 74 is rigid. The buffering member 75 may be an elastomer, such as natural rubber, isoprene rubber, butadiene rubber, chloroprene rubber, EPM, ECO, ACM, ABR, Si, VMQ or FVMQ.

In step S1202, a plurality of micro-devices 73 are formed on the transfer substrate 74.

In step S1203, a receiving substrate 77 for using the micro-devices 73 is provided, the receiving substrate 77 is aligned with the transfer substrate 74.

In step S1204, pressure is applied to the receiving substrate 77 or the transfer device 700 to bond the micro-devices 73 to the receiving substrate 77.

In this embodiment, pressure in a direction toward the micro-devices 73 may be applied to the receiving substrate 77. In an embodiment, pressure in a direction toward the receiving substrate 77 may be applied to the transfer device 700. In other embodiment, the above mentioned pressure can be applied to the receiving substrate 77 and the transfer device 700 simultaneously.

Step S1205: the transfer device 700 is removed.

It can be understood that the transfer device of the above embodiments can be a part of a transfer head or a transfer head.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A transfer device for transferring micro-devices to a receiving substrate, comprising:
   a first substrate;
   at least one transferring substrate located on the first substrate and each of the transferring substrate configured for carrying a plurality of micro-devices; and
   at least one buffering member located between the first substrate and the transfer substrate, wherein the buffering member is used for providing a buffering for the micro-devices; wherein the buffering member comprises a plurality of magnets groups, each of the magnets groups comprises a first magnet and a second magnet, a magnetic field direction of the first magnet and that of the second magnet are opposite to each other, and the first magnet and the second magnet in each magnets group are located face to face to interact magnetically.

2. The transfer device of claim 1. wherein the first substrate has a plurality of wells recessed from the first substrate;

the transfer device further comprises a plurality of platforms, each of the wells accommodates with one of the platforms;

the buffering member comprises a plurality of buffering members, each of the buffering members is located between one of the wells and one of platforms accommodated in the well; and the transfer substrate comprises a plurality of transfer substrate, each of the transfer substrates is supported by one of the platforms.

3. The transfer device of claim 2, wherein the first magnet is embedded on a sidewall of one of the wells, the second magnet is embedded on a sidewall of one of the platforms.

4. The transfer device of claim 2, wherein a material of each platform is opaque, each of the platforms has an opening exposing one of the transfer substrates;

at least one ultraviolet light source is located on a bottom surface of each of the wells; and the transfer device further comprises a plurality of adhesive layers configured to bond the micro-devices and the transfer substrates.

5. The transfer device of claim 2, wherein a material of each platform is transparent;

at least one ultraviolet light source is located on a bottom surface of each of the wells; and the transfer device further comprises a plurality of adhesive layers configured to bond the micro-devices and the transfer substrates.

6. A method for transferring micro-devices, comprises:

providing a transfer device, wherein the transfer device comprises a first substrate and at least one transfer substrate located on the first substrate, at least one buffering member is located between the first substrate and the at least one transfer substrate, the buffering member comprises a plurality of magnets groups, each of the magnets groups comprises a first magnet and a second magnet, a magnetic field direction of the first magnet and that of the second magnet are opposite to each other, and the first magnet and the second magnet in each magnets group are located face to face to interact magnetically:

forming a plurality of micro-devices on the at least one transfer substrate;

providing a receiving substrate, aligning the receiving substrate to the at least one transfer substrate;

pressuring the receiving substrate or the transfer device to bond the micro-devices to the receiving substrate, wherein the buffering member provides a buffering for the micro-devices when pressuring the receiving substrate or the transfer device; and removing the transfer substrate.

7. A method for transferring micro-devices, comprises:

providing a transfer device, wherein the transfer device comprises a first substrate, a plurality of transfer substrate, a plurality of platforms and a plurality of buffering members; the first substrate has a plurality of wells recessed from the first substrate; each of the wells accommodates with one of the platforms; each of the buffering members is located between one of the wells and one of the platforms accommodated in the well; each of the transfer substrates is supported by one of the platforms; at least one ultraviolet light source is located on a bottom surface of each of the wells;

forming a plurality of micro-devices on the transfer substrate, the micro-devices are bonded to the transfer substrates by a plurality of adhesive layers;

providing a receiving substrate, aligning the receiving substrate to the transfer substrates;

pressuring the receiving substrate or the transfer device to bond the micro-devices to the receiving substrate, wherein the buffering member provides a buffering space for the micro-devices when pressuring the receiving substrate or the transfer device;

turning on the at least one ultraviolet light source, wherein the adhesive layer are irradiated by ultraviolet lights emitted from the at least one ultraviolet light source; and removing the transfer substrate.

8. The method of claim 7, wherein the platforms are opaque, each of the platforms has an opening exposing one of the transfer substrates.

9. The method of claim 7, wherein the platforms are transparent.

* * * * *